US012613294B2

(12) United States Patent　　　　(10) Patent No.:　US 12,613,294 B2

Rohde et al.　　　　　　　　　　　　(45) Date of Patent:　Apr. 28, 2026

(54) CALIBRATION METHOD FOR AN ELECTROMAGNETIC INDUCTION METHOD, MEASURING ARRANGEMENT FOR CARRYING OUT AND APPLYING THE METHOD

(71) Applicant: Alfred-Wegener-Institut, Helmholtz-Zentrum fuer Polar- und Meeresforschung, Bremerhaven (DE)

(72) Inventors: Jan Rohde, Bremerhaven (DE); Stefan Hendricks, Bremen (DE); Christian Haas, Bremerhaven (DE); Thomas Zwanzig, Hannover (DE)

(73) Assignee: ALFRED-WEGENER-INSTITUT, HELMHOLTZ-ZENTRUM FUER POLAR- UND MEERESFORSCHUNG, Bremerhaven (DE)

( * ) Notice: Subject to any disclaimer, the term of this patent is extended or adjusted under 35 U.S.C. 154(b) by 189 days.

(21) Appl. No.: 18/687,826

(22) PCT Filed: Sep. 26, 2022

(86) PCT No.: PCT/DE2022/100712

§ 371 (c)(1),
(2) Date: Feb. 29, 2024

(87) PCT Pub. No.: WO2023/051868

PCT Pub. Date: Apr. 6, 2023

(65) Prior Publication Data

US 2024/0353505 A1　　Oct. 24, 2024

(30) Foreign Application Priority Data

Sep. 28, 2021　(DE) ..................... 10 2021 125 036.6

(51) Int. Cl.
　G01R 33/00　　(2006.01)
　G01B 7/06　　(2006.01)
　G01R 33/12　　(2006.01)
(52) U.S. Cl.
　CPC .......... G01R 33/0035 (2013.01); G01B 7/10 (2013.01); G01R 33/12 (2013.01)
(58) Field of Classification Search
　CPC　G01R 33/0035; G01R 27/26; G01R 27/2611; G01R 33/12; G01R 33/24; G01R 35/00; G01B 7/10

(Continued)

(56) References Cited

U.S. PATENT DOCUMENTS

| | | | |
|---|---|---|---|
| 8,441,267 B2 * | 5/2013 | Eberheim | G01N 27/023 |
| | | | 324/656 |
| 2015/0268369 A1 * | 9/2015 | Dodds | G01R 35/005 |
| | | | 324/334 |

(Continued)

FOREIGN PATENT DOCUMENTS

| | | | | |
|---|---|---|---|---|
| DE | 4000018 C2 * | 11/1997 | | G01V 3/107 |
| DE | 202005020193 U1 | 3/2006 | | |

(Continued)

OTHER PUBLICATIONS

Haas, Christian et al.; "Airborne Electromagnetic Measurements of Sea Ice Thickness: Methods and Applications"; *Arctic Sea Ice Thickness: Past, Present and Future*; Jan. 1, 2007; pp. 136-148; ISBN 92-79-02803-0; Office for Official Publications of the European Communities; Luxembourg.

(Continued)

*Primary Examiner* — Lee E Rodak
*Assistant Examiner* — Taqi R Nasir
(74) *Attorney, Agent, or Firm* — LEYDIG, VOIT & MAYER, LTD.

(57)　　　　　ABSTRACT

An indirect calibration method for an electromagnetic induction method for determining physical parameters of an (Continued)

electrically conductive medium from a ratio (HS/HP) of a magnetic secondary field (HS), received in a receiving coil, to a magnetic primary field (HP) emitted from a transmitting coil electrically connected to a transmission signal generator, in which as measurement for the ratio (HS/HP) a received voltage (URx) is measured at an output of a receive amplifier electrically connected to the receiving coil, which is calibrated by series connection of at least one calibration coil and of a changeable calibration resistor and of a calibration factor (HCx/HP) which is adjustable therethrough, the receiving coil being permanently inductively coupled with the calibration coil, a calibration pulse, generated in the calibration coil, inducing a calibration field (HCx), inducing a magnetic flux in the receiving coil, areas and winding numbers of the receiving and calibration coils being known.

8 Claims, 5 Drawing Sheets

(58) Field of Classification Search
USPC .... 324/207, 236, 158.1, 300–326, 253, 761, 324/709
See application file for complete search history.

(56) References Cited

U.S. PATENT DOCUMENTS

| | | |
|---|---|---|
| 2018/0136290 A1 | 5/2018 | Aikawa |
| 2022/0128500 A1 | 4/2022 | Tan et al. |

FOREIGN PATENT DOCUMENTS

| | | | |
|---|---|---|---|
| DE | 102009026403 A1 | 11/2010 | |
| DE | 102018220532 A1 | 6/2020 | |
| EP | 2657762 A1 | 10/2013 | |
| EP | 2790030 A1 | 10/2014 | |
| WO | WO-2012146930 A2 * | 11/2012 | ......... G01R 33/1223 |

OTHER PUBLICATIONS

Wang, Haowen et al.; "A Time-Domain Feedback Calibration Method for Air-Coilmagnetic Sensor"; *Measurement*; Mar. 1, 2019; pp. 61-70 (Preview); vol. 135; ScienceDirect—Elsevier; Amsterdam, The Netherlands.

* cited by examiner

CALIBRATION METHOD FOR AN ELECTROMAGNETIC INDUCTION METHOD, MEASURING ARRANGEMENT FOR CARRYING OUT AND APPLYING THE METHOD

CROSS-REFERENCE TO PRIOR APPLICATIONS

This application is a U.S. National Phase application under 35 U.S.C. § 371 of International Application No. PCT/DE2022/100712, filed on Sep. 26, 2022, and claims benefit to German Patent Application No. DE 10 2021 125 036.6, filed on Sep. 28, 2021. The International Application was published in German on Apr. 6, 2023 as WO 2023/051868 A1 under PCT Article 21 (2).

FIELD

The invention relates to an indirect calibration method for an electromagnetic induction method for the determining of physical parameters of an electrically conductive medium from the ratio of a magnetic secondary field received in a receiving coil to a magnetic primary field emitted by a transmitting coil electrically connected to a transmitting signal generator, wherein as measurement for the ratio, a received voltage is measured at an output of a receive amplifier electrically connected to the receiving coil, which is calibrated by means of a series connection of at least one calibration coil and of a variable calibration resistor and of a calibration factor able to be adjusted by the latter, and to a measuring assembly for carrying out the method with at least one transmitting coil and a receiving coil and with a series connection at least of a calibration coil and a calibration resistor.

BACKGROUND

In the electromagnetic induction method, the effect is utilized that eddy currents are induced by strong magnetic alternating fields in a conductive medium. These eddy currents are the cause of secondary magnetic fields which can be measured by amount and phase. Thus, the mean conductivity of the medium can be measured approximately as a physical parameter. The measurement can be carried out either in the time domain (amplitude decay time of the secondary field) or in the frequency domain (amplitude- and phase lag of the secondary field).

In the measuring assembly for carrying out the method, a strong magnetic alternating field is generated through a transmitting coil. At a distance in the metre range from the transmitting coil, a receiving coil is arranged. This receiving coil detects the secondary field emitted from the medium at the substrate and converts it into a voltage. This voltage is amplified and is measured in a data detection for amount and phase (complex value). At the site of the receiving coil, alongside the secondary field, a very strong primary field is also present, which is generated by the transmitting coil. The evaluation of the secondary field takes place as a ratio between secondary field and primary field at the site of the receiving coil. As the primary field is stronger than the secondary field by some orders of magnitude, the ratio of the fields is usually indicated in PPM (Parts Per Million). As the secondary field is very weak, the voltage which is induced in the receiving coil must be amplified. So that the strong primary field does not drive the required amplifier to saturation, generally a compensation coil is also installed in the measuring assembly, which is arranged close to the transmitting coil and is oriented so that it compensates the voltage, induced through the primary field, in the receiving coil. In order to be able to make a statement concerning which measured voltage corresponds to which ratio of secondary field to primary field, a calibration of the measuring assembly must be carried out. This takes place by means of a calibration coil which generates a known ratio of a calibration field to primary field.

The various coils are explained more closely in the following in their functions and arrangements in a measuring assembly for carrying out the electromagnetic induction method.

transmitting coil generates the transmission field (magnetic alternating field) through the transmission current, which is generated by a generator for the transmitting signal, pick-up coil arranged at the transmitting coil, in order to measure the strength of the transmission field, compensation coil arranged at the transmission coil, compensates the voltage induced through the primary field (magnetic alternating field) in the receiving coil (increase sensitivity secondary field), receiving coil arranged distant from the transmission coil in the metre range, receives the secondary field, calibration coil generates through the calibration current a calibration field as secondary field (also calibration signal or calibration pulse) with exactly known amplitude and phase at the time of the calibration.

Basically, the direct calibrating of the received voltage can be differentiated through direct generating of a calibration pulse with known amplitude and phase from the indirect calibrating, in which a calibration coil is used for generating the calibration pulse. In the series connection of calibration coil and calibration resistor, a complex resistance results, which influences the phase and amplitude of the changeable calibration pulse. The ratio of calibration field to primary field is designated as "calibration factor", which is determined in the prior art hitherto purely computationally from coil geometries. The calibration field functions here in the calibration as secondary field, and the calibration factor represents in actuality the target value which is to be measured by the measuring assembly on occurrence of the calibration pulse in the calibration coil. The invention is concerned with the indirect calibration method in application in the electromagnetic induction method, especially with the determining of the calibration factor.

The indirect calibration method is explained in principle in DE 40 00 018 C2. For the calibration of the system, a further separate coil is installed in the system. This calibration coil generates a ratio of secondary field to primary field, known by amount and phase, at the site of the receiving coil, and enables the compensation of all amplifications and phase shifts of the measuring assembly (sensor system and downstream electronics). Usually, the calibration coil is installed in a coplanar manner between transmitting- and receiving coil. During the calibration process, it is ensured that no secondary field can be measured through the conducting medium which is to be examined. By bridging the connections of the calibration coil with a known complex resistor, a current is now induced in the coil through the primary field, which current in turn results in a secondary calibration field at the receiving coil. By calculating the magnetic moment of the calibration coil, thereby the ratio of secondary calibration field to primary field can be calculated for the calibration of the measuring assembly. For calculation of the magnetic moment, the distances between transmitting-, calibration- and receiving coil must be determined very precisely. The distances enter to the third power into the calculation of the moment, whereby this measurement constitutes a great source of error. In addition, the coils must have a distinct distance from one another, so that the approximation concerning the magnetic moment can be applied.

From WO 2012/146930 A2 an indirect calibration method in the field of material testing is known, which brings one or more calibration coils temporarily into the vicinity of a magnetometer during the calibration, which are intended to simulate the effect of a metal object in the vicinity of the magnetometer. The calibration current in the calibration coils is generated through the magnetic field of the magnetometer, wherein the calibration coils are intended to increase the sensitivity with respect thereto. No statements are made concerning the calibration process itself, and in particular concerning how the calibration factor is determined. From EP 2 790 030 A1 a direct calibration method is known, in which an active pulse of known size is directed through the calibration coil. The aim is to measure the absolute field strength and to correct the hysteresis in the sensor. From DE 10 2009 026 403 A1 a system is known for a geophysical measuring method, in which the path between transmitting- and receiving coil is monitored by the inductive coupling between both being measured. For diagnosis purposes, the measurement of a first electrical signal in the primary circuit with closed short circuit path is sufficient, via which a defined inductive coupling between transmitting- and receiving coil takes place, wherein, however, the defining remains unclear. The impedance of the two coils is measured, wherein the primary- and secondary coil are connected via a short circuit path, and the voltages or respectively currents are measured at these. EP 2 657 762 A2 concerns the measuring of conductivities of substrates in geophysics. However, no calibration is carried out, but rather the fluctuations of the primary field are compensated. In DE 10 2018 220 532 A1 a direct calibration method is described, which operates with a known pulse into the receiving coil. The calibration takes place by applying a pulsed direct voltage to the transmitting- or respectively receiving coil through the calibration device. A separate calibration coil is not present. Also from DE 20 2005 020 193 U1 a direct calibration method is known in which defined magnetic fields are generated in order to calibrate magnetic field probes. Their influences on the generated field are to be compensated.

From US 2015/0 268 369 A1, in turn, a direct calibration method is known, in which the calibration pulse has a known voltage and form. The voltage at the calibration coil, which must have few windings for the avoidance of great inductivities and which is only placed temporarily close to the receiving coil, is measured absolutely and therefrom the current is determined through the calibration coil in the series connection with the calibration resistor. This known current then serves for the direct calibration of the receiving coil. The sensitivity of the measuring assembly is calculated via the geometry of the receiving coil. The calibration factor must be calculated beforehand at a low frequency and serves as support point for a relative amplitude- and phase measurement at higher frequencies. The aim of the known measuring assembly is to correct fluctuations in the strength of the transmitting signal.

From the publication Wang, Haowen [et al.]: A time-domain feedback calibration method for air-coil magnetic sensor, in: Measurement, Vol. 135, 2029, p. 61-70. —ISSN 0263-2241 it is known to attempt, via an iterative algorithm, to reconstruct as well as possible the calibration signal which is fed into the calibration coil, at the output of the receive amplifier. The transfer function of the receiving system is adapted here until the error between calibration signal and receive signal is small enough. For this, the form of the calibration pulse must be determined as accurately as possible. Also in this direct calibration method, the receive system is to be calibrated via a known calibration signal, the calibration factor is therefore again known. As calibration signal a decaying field is used, which is generated through the interruption of a direct voltage through the calibration coil. The voltage at the calibration coil is not measured. Through the algorithm, the determining of the transfer function is independent of the mutual inductance between calibration coil and receiving coil. For presence of a secondary field, the calibration must take place close to the ground, wherein during the entire calibration process the transmitting coil is switched off.

From the publication Haas, Christian [et al.]: Airborne electromagnetic measurements of sea ice thickness: methods and application. Luxembourg: Arctic sea ice thickness: past, present and future. Office for Official Publications of the European Communities, 2006, p. 136-148—ISBN 92-79-02803-0 it is known to use an indirect calibration method for an electromagnetic induction method for the determining of physical parameters of an electrically conductive medium. The physical parameter which is to be determined concerns here the conductivity of the conductive medium, in this case then the seawater, from which then the thickness of sea ice floating thereon can be derived.

The known calibration methods can therefore all be assigned to direct or indirect calibration, wherein all known methods are basically designed in one stage. In the direct calibration, a direct feeding of a known voltage or of a known current into the calibration coil is used. In the indirect calibration, with use of a calibration coil, the calibration factor is either calculated via the coil geometries and the measurement of the resistance of the calibration coil, or it is assumed to be known. The calibration method nearest to the invention is known from WO 2012/146930 A1 against the background of DE 40 00 018 C2.

SUMMARY

In an embodiment, the present invention provides an indirect calibration method for an electromagnetic induction method for determining physical parameters of an electrically conductive medium from a ratio (HS/HP) of a magnetic secondary field (HS), received in a receiving coil, to a magnetic primary field (HP) emitted from a transmitting coil electrically connected to a transmission signal generator, in which as measurement for the ratio (HS/HP) a received voltage (URx) is measured at an output of a receive amplifier electrically connected to the receiving coil, which is calibrated by a series connection of at least one calibration coil and of a changeable calibration resistor and of a calibration factor (HCx/HP) which is adjustable therethrough, the receiving coil being permanently inductively coupled with the calibration coil, a calibration pulse, generated in the calibration coil, inducing a calibration field (HCx), which induces a magnetic flux in the receiving coil, areas and winding numbers of receiving coil and calibration coil being known, the calibration method comprising: a first stage, in which the transmission coil is inactive or shielded, and a calibration signal generator is connected to the series connection of calibration resistor and calibration coil, and in which the calibration pulse is generated electrically by the calibration signal generator, and with adjusting of the calibration resistor a calibration voltage (Ucal) at the series connection of calibration coil and calibration resistor and the received voltage (URXin) at the receiving coil at an input of the receive amplifier are measured simultaneously for determining a generated mutual inductance (MRC) between the calibration coil and the receiving coil, from which with inclusion of the known areas and winding numbers of calibration coil and receiving coil, the calibration factor (HCx/HP) is derived; and a second stage, in which the transmitting coil is active via the transmitting signal generator, and the calibration coil is short-circuited via the calibration resistor which is adjusted in the first stage, and in which the calibration pulse is generated inductively through a primary field (HP) generated by transmitting signal generator and transmitting coil, and in which the received voltage is measured at the output of the receive amplifier, in order to relate the received voltage to the ratio which is to be measured, using the calibration factor (HCx/HP), which is determined metrologically in the first stage.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

Figure 1:
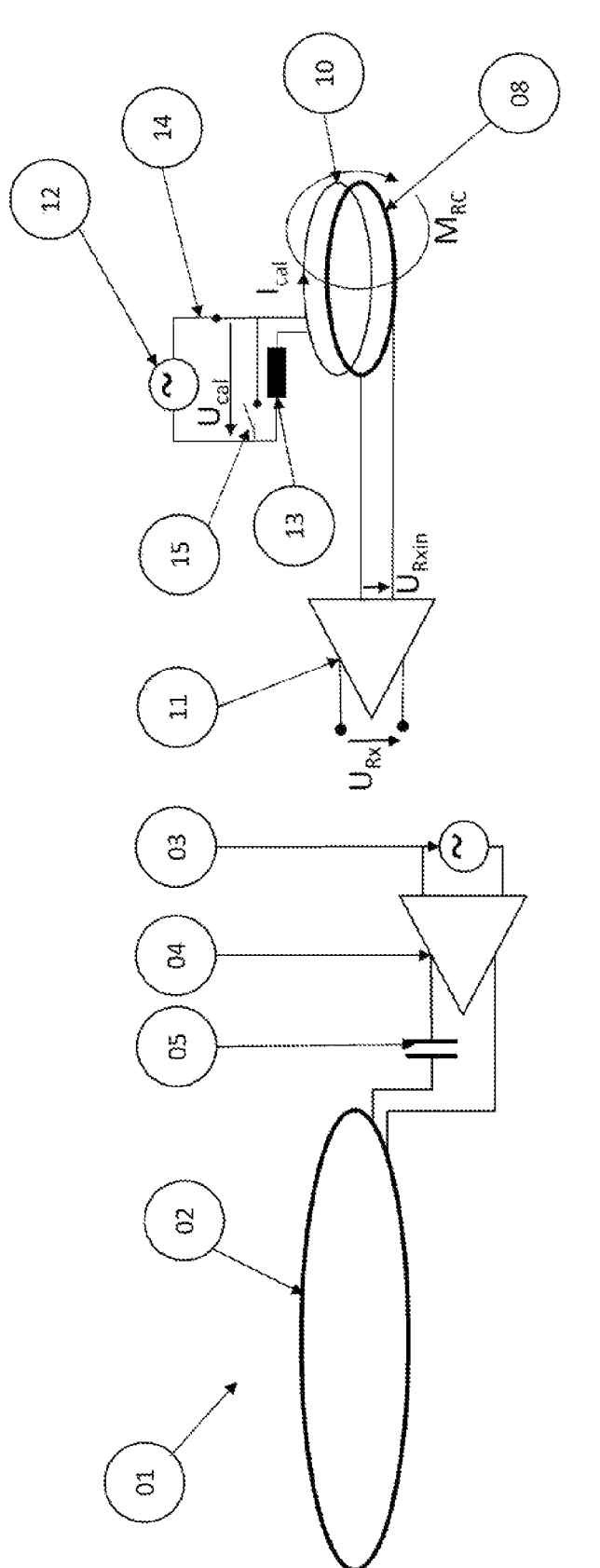
FIG. 1 a simplified measuring assembly in the metrological determining of the calibration factor (first stage S1)

In an embodiment, the present invention provides a calibration method for an electromagnetic induction method in which the calibration factor does not have to be calculated in a way which is complex and distinctly prone to error. Furthermore, the invention enables a particularly compact measuring assembly.

In an embodiment, the receiving coil is permanently inductively coupled with the calibration coil, wherein a calibration pulse generated in the calibration coil induces a calibration field and this induces a magnetic flux in the receiving coil, and wherein the areas and winding numbers of receiving coil and calibration coil are known, and that the calibration method is designed in two stages and comprises:

a first stage, in which the transmission coil is inactive or shielded, and a calibration signal generator is connected to the series connection of calibration resistor and calibration coil, and in which the calibration pulse is generated electrically by the calibration signal generator, and with adjusting of the calibration resistor a calibration voltage at the series connection of calibration coil and calibration resistor and the received voltage at the receiving coil at an input of the receive amplifier are measured simultaneously for determining a generated mutual inductance between the calibration coil and the receiving coil, from which with inclusion of the known areas and winding numbers of calibration coil and receiving coil the calibration factor is derived, and a second stage, in which the transmitting coil is active via the transmitting signal generator, and the calibration coil is short-circuited via the calibration resistor which is adjusted in the first stage, and in which the calibration pulse is generated inductively through the primary field generated by the transmitting signal generator and transmitting coil, and in which the received voltage is measured at the output of the receive amplifier, in order to relate this to the ratio which is to be measured, using the calibration factor which is determined metrologically in the first stage.

In the calibration method according to the invention, which represents an indirect calibration method with the presence of a calibration coil, in the first stage the calibration factor is firstly determined in a purely metrological manner through the measuring of a mutual inductance, brought about owing to an electrically generated calibration pulse, between the receiving coil and the calibration coil which is inductively coupled therewith. Here, the inductive coupling between calibration coil and receiving coil is so strong that it is able to be measured. A pure calculation via the coil geometries and a measuring of the resistance of the calibration coil is not carried out in the invention, whereby the error occurring in the determining of the calibration factor can be distinctly reduced. In the second stage of the method according to the invention, the actual calibration of the measuring assembly is then carried out with the calibration factor which was determined metrologically in the first stage, wherein here the calibration pulse is then generated through the primary field. Whereas in the first stage of the method the received voltage is measured at the connections of the receiving coil (as at the input of the receive amplifier), in the second stage the received voltage is measured behind the receive amplifier (therefore at the output of the receive amplifier). This "unknown" received voltage is then related to the ratio to be measured of secondary to primary field using the known calibration factor. Here, the value of the calibration resistor, set in the first stage, which is short-circuited in the second stage via the calibration coil, is not changed. The calibration factor therefore indicates which ratio of secondary field to primary field is present at the moment of calibration at the receiving coil, whereby the measured voltage value can be related thereto.

The difference of the method according to the invention from the known indirect calibration methods consists in the manner as to how the calibration pulse is generated in the calibration coil, and in the purely metrological determining of the size of the calibration field or respectively of the calibration factor. The combination of the arrangement of calibration- and receiving coil in the least possible distance and the thereby enabled direct measuring of the inductive coupling by simple means, and the subsequent calibrating via the present primary field is characteristic for the invention.

In addition, the intensive source of error of the coil distance entering into the pure calculation of the calibration factor is omitted in the invention; the calibration thereby becomes distinctly more accurate. In the first stage, the transmitting coil is inactive (no current flows through the transmitting coil) or shielded, so that no transmitting signal can arrive from the transmitting coil at the receiving coil. Instead, a calibration signal generator is electrically connected to the calibration coil, which calibration signal generator emits a changeable calibration current. This can concern here a sinusoidal signal; other pulsating alternating signals for the generating of induced currents are also suitable. The calibration coil is electrically connected in a series connection with the calibration signal generator and with the calibration resistor, which can be changeable and purely ohmic or else already complex in nature; a complex calibration resistance results through the calibration coil. The pulsating calibration current generates in the calibration coil a calibration pulse (induced current in the coil with the result of a secondary magnetic field), which in turn generates through the inductive coupling a magnetic flux in the receiving coil (therefore the terms "inductive coupling" and "magnetic coupling" are equivalent), which in turn generates a received voltage at the connections of the receiving coil (at the input of the receive amplifier). Then, at the same time, the received- and the calibration voltage are measured at the connections of the signal generator, therefore via the series connection of calibration coil and calibration resistor, the complex calibration resistance, and before the receive amplifier. Via these voltages, the mutual inductance between receiving- and calibration coil is calculated, from which, in turn, the calibration factor is determined as ratio of a secondary field, induced through the primary field in the calibration coil, and of the primary field at the site of the receiving coil. As a voltage ratio is used for the determining of the calibration factor, the amplitude and the phase of the calibration signal, fed into the calibration coil, are not of importance in the invention.

The secondary field, generated by the environment, is very small compared to the calibration field of the calibration coil and can be regarded as negligible in its influence on the receiving coil. Therefore, it can be present during the calibration without generating a significant error. However, in order to also prevent this small error, it is advantageous and preferred according to a first modification of the invention if the secondary field is shielded at least in the second stage. This can take place for example through a metallic base shielding magnetic fields, or through a very large local spacing. Also for measuring the calibration factor in the first stage, the entire measuring assembly can be brought into an environment in which no secondary field can be measured by a conductive medium in the environment. Alternatively, the conductive medium can also be shielded in the first stage.

According to a further modification of the calibration method according to the invention, preferably and advantageously the first stage can be carried out chronologically independently of the second stage. With a determining of the calibration factor, independent of the calibration of the measuring assembly in the second stage, on a purely metrological basis in the first stage, this can be measured for example only once in a laboratory and then applied in the measuring operation in the second stage. The calibration factor can, however, also be measured in the field in the present (and thus once or several times or respectively also as often as desired) before the actual calibration in the second stage. Through this chronologically closely associated determining of the calibration factor according to the first stage for the calibration according to the second stage, a more precise calibration is achieved in the invention, which also takes into consideration time-dependent effects such as ambient temperature and material ageing of the coils in a flexible manner. Further embodiments for the determining of the calibration factor on a metrological basis, taking into consideration simplifying boundary conditions, are to be seen from the example embodiments.

Furthermore, with the invention a measuring assembly is described for carrying out the previously explained two-stage calibration method with at least one transmitting coil and a receiving coil, and with a series connection of a calibration coil and a changeable calibration resistor. According to the invention, provision is made in this measuring assembly that the receiving coil and the calibration coil are arranged adjacent to one another with generation of a permanent inductive coupling, and that a calibration signal generator is provided, which is electrically connectable to the series connection. Through the omission of a spatial distance between the receiving coil and the calibration coil, the measuring assembly can be configured in a distinctly more compact manner than hitherto. A saving of space results with regard to the length of the measuring assembly of up to 35% of the total length. The configuration of calibration- and receiving coil can take place jointly and thus in a particularly efficient and cost-saving manner.

Furthermore, in a modification of the measuring assembly, preferably and advantageously it is indicated that a first switch is provided, via which the calibration coil is electrically connectable via the calibration resistor with the calibration signal generator. After closing of this switch and switching on of the calibration signal generator, the calibration factor is determined metrologically in the first stage. In a further modification, preferably and advantageously provision is made that a further switch is provided, via which the calibration coil is electrically connectable only with the calibration resistor. The calibration signal generator for the calibration signal drops out of the series connection in the closed state of the further switch. After closing of the further switch and switching on of the signal generator for the transmitting signal, the calibration can be carried out according to the second stage of the calibration method with the use of the previously metrologically determined calibration factor. In connection with the method according to the invention it was already explained that the calibration factor can be determined metrologically in the first stage chronologically and spatially independently (laboratory measurement) from the calibration in the second stage or in connection therewith (field measurement). In a laboratory measurement, a simple measuring assembly only has the first switch. The actual measuring assembly in the field then has only the further switch. With a connection of the two stages of the calibration, the measuring assembly then has both switches accordingly. Thereby, the calibration becomes flexible, and environmental influences and ageing of the individual components can be taken into consideration.

In a next modification of the measuring assembly described, preferably and advantageously provision is made that the receiving coil and the calibration coil are arranged on a shared core and have an area ratio of 1. Through this formation, the metrological determining of the calibration factor in the first stage is facilitated, and the measuring assembly is further simplified. The receiving coil and the calibration coil can have, for example, winding ratios of 200 to 1 or 200 to 2. Both coils can also preferably and advantageously have a winding ratio of 1; they then have an identical number of windings. Also through this boundary condition the metrological determining of the calibration factor is simplified in the first stage. It is usual, however, that the receiving coil has a greater winding number than the calibration coil, so that the winding ratio is not equal to one and enters into the determining of the calibration factor. Further explanations concerning the present invention in its expression as a method and as an arrangement, and its respectively addressed modifications can be seen from the indicated example embodiment.

Beforehand, in addition a particularly preferred application of the method or respectively of the measuring assembly described is indicated, in which the thickness of sea ice is determined as physical parameter. This can take place within an air-assisted application of the magnetic induction method, as is used for various applications in geophysics, for example for geological mapping or for groundwater searching. Magnetometers are used respectively, the mode of operation and configuration of which can be significantly improved through the present invention. In the application for determining the thickness of sea ice, a strong magnetic alternating field is emitted by a towed probe. In a conductive medium, for example saline seawater, eddy currents are thereby induced, which in turn result in secondary fields. These secondary fields are received in the towed probe and are evaluated for amount and phase, including calibration. From the amplitude- and phase information, either the apparent conductivity of the medium or else the distance to the surface to a conductive medium can be calculated, which corresponds to the distance to the underside of the ice. Via a further distance measurement, for example with a laser distance meter, the distance to the upper side of the ice can be measured. The difference of these two distances is the thickness of the ice. The conductive medium can also concern here a conductive substrate in a natural environment.

In FIG. 1 a simplified measuring assembly 01 is shown, in which on the left a transmitting coil 02 is illustrated, which is connected to a transmitting signal generator 03 for generating a changeable (in the example embodiment in the frequency domain, in the time domain, it would concern a pulsating signal) transmitting signal (sinusoidal in the example embodiment, a transmission amplifier 04, and a resonance capacitor 05. As is to be explained in FIG. 1 the metrological determining of the calibration factor $H_{Cx}/H_P$ in the first stage S1, the transmitting signal generator 03 is switched off, the transmitting coil 02 therefore does not transmit a transmission field $H_{Tx}$, which could arrive via a primary path 06 to a receiving coil 08. Likewise, in the example embodiment which is shown, no conductive medium 09 is in influencing proximity, through which a secondary field $H_s$ could be generated via a secondary path 07 in the receiving coil 08.

In FIG. 1 on the right the receiving coil 08 is illustrated, to which a calibration coil 10 is arranged at the smallest possible distance, so that the two coils 08,10 are inductively coupled to one another particularly strongly, which can be further intensified by provision of iron cores. The receiving coil 08 is connected to a receive amplifier 11, at the input of which a voltage $U_{RXin}$, induced in the receiving coil 08, is applied. At the output of the receive amplifier 11 a voltage $U_{Rx}$ is generated. The calibration coil 10 is connected to a calibration signal generator 12 for generating a calibration pulse in the calibration coil 10, and to an adjustable calibration resistor 13, via which the amplitude and the phase of the calibration field $H_{Cx}$, generated through the calibration pulse of the calibration coil 10, (electrical generation in the first stage S1 through the active calibration signal generator 12), can be adjusted. The series connection is able to be opened and closed via a first switch 14, which serves for determining the calibration factor $H_{Cx}/H_P$ (first stage S1). Through the series connection, in the closed state of the first switch 14 and with switched on calibration signal generator 12, a current $I_{cal}$ flows, a voltage $U_{cal}$ is applied at the series connection of calibration coil 10 and calibration resistor 13 (these two generate together a complex calibration resistance), which is used for determining the strong inductive coupling between calibration coil 10 and receiving coil 08. The measure for this is the mutual inductance $M_{RC}$. In FIG. 1 in addition a further switch 15 is shown, which is used in the actual calibration in stage S2, cf. FIG. 2.

To determine the calibration factor $H_{Cx}/H_P$, the transmitting signal generator 03 for generating the transmitting signal is switched off, the conductive medium 09 in the selected example embodiment is absent or shielded. The receiving coil 08 and the calibration coil 10 are coupled inductively strongly to one another. The first switch 14 is closed, the further switch 15 is open. The calibration signal generator 12 is switched on and generates a pulse-like current $I_{Cal}$ in the calibration coil 10, which in turn generates a magnetic flux through the receiving coil 08, which in turn induces a voltage $U_{Rxin}$ at the connections of the receiving coil 08. Via the voltages $U_{Cal}$ (voltage at the series connection of calibration coil 10 and the calibration resistor 13, serves as reference) and $U_{RXin}$, the mutual inductance $M_{RC}$ between the receiving coil 08 and the calibration coil 10 is determined. For this, the voltages $U_{cal}$ and $U_{RXin}$ are measured, wherein the voltage $U_{RXin}$ is measured for amount and phase in relation to $U_{cal}$.

For a transmitting signal (with precisely one frequency in the frequency domain) formed sinusoidally in the time domain in the example embodiment and accordingly for a sinusoidal calibration signal of the same frequency and for the steady state, it can be shown that the mutual inductance $M_{RC}$ can be calculated as follows:

$$M_{RC} = \frac{\underline{U}_{Rxin} \cdot Z_{Cx}}{j\omega \cdot \underline{U}_{cal}}$$

Here, all the underlined values are complex. $\underline{U}_{Rxin}$ and $\underline{U}_{cal}$ are the voltages at the receiving coil 08 and via the series connection of calibration resistor 13 and calibration coil 10. $Z_{Cx}$ is the complex resistance (impedance) of the series connection of calibration coil 10 and calibration resistor 13, $\omega$ is the angular frequency and j is the imaginary unit. Furthermore, it can be shown that the calibration factor as ratio of $H_{Cx}$ and $H_P$ can be calculated as follows:

$$\frac{H_{Cx}}{H_p} = j\omega \cdot \frac{M_{RC} \cdot A_{Cx} \cdot N_{Cx}}{A_{Rx} \cdot N_{Rx} \cdot Z_{Cx}}$$

By using the mutual inductance $M_{RC}$ the impedance $Z_{Cx}$ is omitted and the calibration factor $H_{Cx}/H_P$ is simplified to $$\frac{H_{Cx}}{H_p} = j\omega \cdot \frac{\underline{U}_{Rxin} \cdot A_{Cx} \cdot N_{Cx}}{\underline{U}_{cal} \cdot A_{Rx} \cdot N_{Rx}}$$

Here, $A_{Cx}$ and $A_{Rx}$ are the effective areas and $N_{Cx}$ and $N_{Rx}$ the winding numbers of the calibration coil 10 or respectively of the receiving coil 08. $\underline{Hc}_x$ is the secondary field generated in the calibration coil 10 (electrical generation in the first stage S1 by the active calibration signal generator 12, inductive generation in the second stage S2 through the active transmitting signal generator 03) and $\underline{H}_P$ is the respectively occurring primary field at the site of the receiving coil 08 (with and without active transmitting coil 02). The underlined field values $\underline{Hc}_x$ and $\underline{H}_P$ indicate again that these are treated as complex values and accordingly have an amount and a phase. It has proved to be particularly advantageous that the windings of the receiving coil 08 and of the calibration coil 10 are wound onto the same frame. With sufficiently thin wires, the areas $A_{Cx}$ and $A_{Rx}$ can thus be assumed to be identical and their ratio becomes to one. The same applies to identical winding numbers for both coils 08, 10, the ratio of which then likewise becomes to one, wherein it was already stated further above that generally the winding number of the receiving coil 08 is greater by orders of magnitude than the winding number of the calibration coil 10. The calibration factor $H_{Cx}/H_P$ can therefore be measured by simple measurement of the voltage $U_{RXin}$, standardized to the voltage $U_{cal}$ at the input of the receive amplifier 11, and applied to the actual calibration in the second stage S2.

Figure 2:
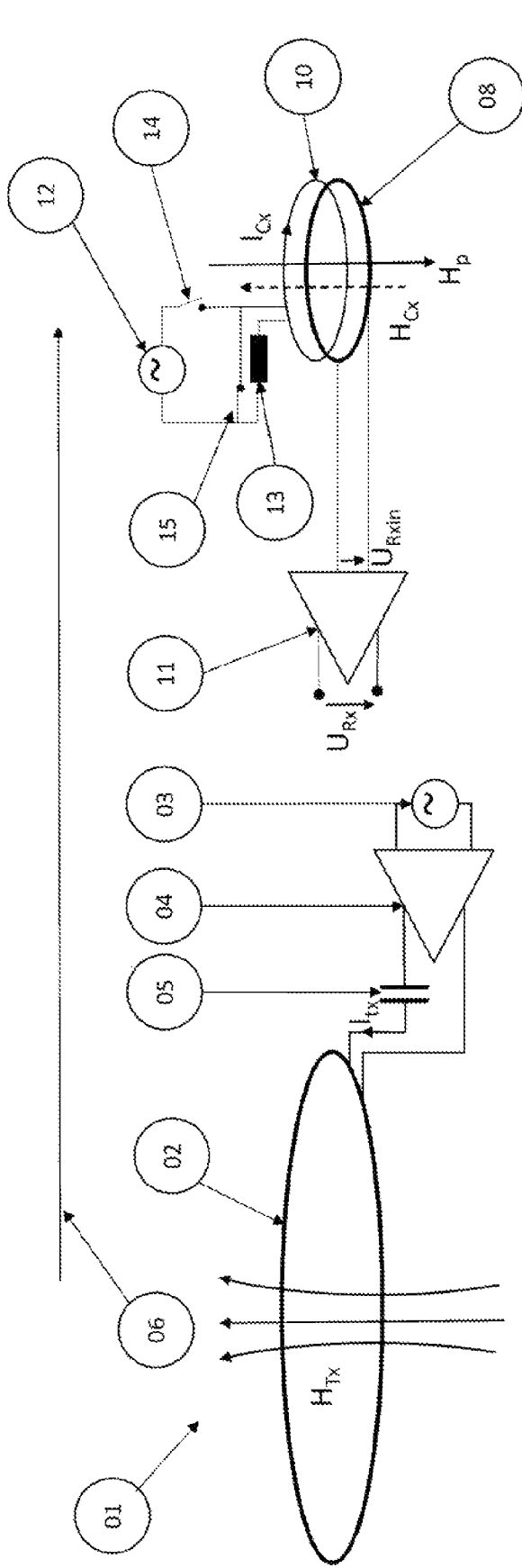
FIG. 2 the simplified measuring assembly according to FIG. 1 in the carrying out of the calibration (second stage S2)

In FIG. 2 a simplified measuring assembly 01 is shown, wherein the set-up corresponds to the simplified measuring assembly 01 according to FIG. 1, which serves for the metrological determining of the calibration factor $H_{Cx}/H_P$ (first stage S1). The simplified measuring assembly 01 according to FIG. 02, on the other hand, serves for the actual calibration (second stage S2). It is to be noted that in the example embodiment which is shown, the measuring assembly 01 has both the first switch 14 and also the further switch 15 in a combination. Such a combination enables a prompt determining of the calibration factor $H_{Cx}/H_P$ also in the measuring operation in the field and a compact measuring assembly 01. The two calibration stages S1 and S2 can, however, also be carried out entirely separately from one another chronologically and spatially. Then in the field during measuring operation in the calibration in the second stage S2 the calibration factor $H_{Cx}/H_P$ is used, which was determined once in the first stage S1 for example metrologically in a laboratory. Time-dependent changes of the measuring assembly 01 and environmental influences can then, however, not be taken into consideration.

To carry out the actual calibration (second stage S2), the measuring assembly 01 in the example embodiment which is shown is brought into an environment in which no secondary field $H_s$ can be measured by a conductive medium 09, for example with the aircraft at a great height over the substrate. The further switch 15 is then closed (with a combined arrangement, accordingly the first switch 14 open). The connections of the calibration coil 10 are connected via the calibration resistor 13, which is indeed changeable but in the second stage S2 is set constant to the value from the first stage S1, and are thereby short-circuited. The transmitting signal generator 03 is switched on and acts upon the transmission coil 02 with a chronologically changeable current $I_{Tx}$. This generates accordingly the transmission field $H_{Tx}$ which arrives via the primary path 06 to the calibration coil 10, generates there the primary field $H_P$ (now under the influence of the transmission field $H_{Tx}$) and induces the calibration current $I_{Cx}$, which can be influenced in its phase and amplitude by the calibration resistor 13. The current $I_{Cx}$, in turn, generates a magnetic flux through the area of the receiving coil 08, which is equivalent to the magnetic calibration field $H_{Cx}$ at the site of the receiving coil 08, which is strongly coupled inductively with the calibration coil 10. The generated calibration field $H_{Cx}$ therefore represents at the time of the calibration in the second stage S2 a known secondary field $H_s$ (in relation to the unknown, occurring primary field $H_P$). The voltage $U_{Rx}$ at the output of the receive amplifier 11 is measured before and while the calibration field $H_{Cx}$ is present. Through the calibration factor ($H_{Cx}/H_P$) known from the first stage S1, the measuring assembly 01 is then calibrated through a corresponding change of the calibration resistor 13.

Figure 3:
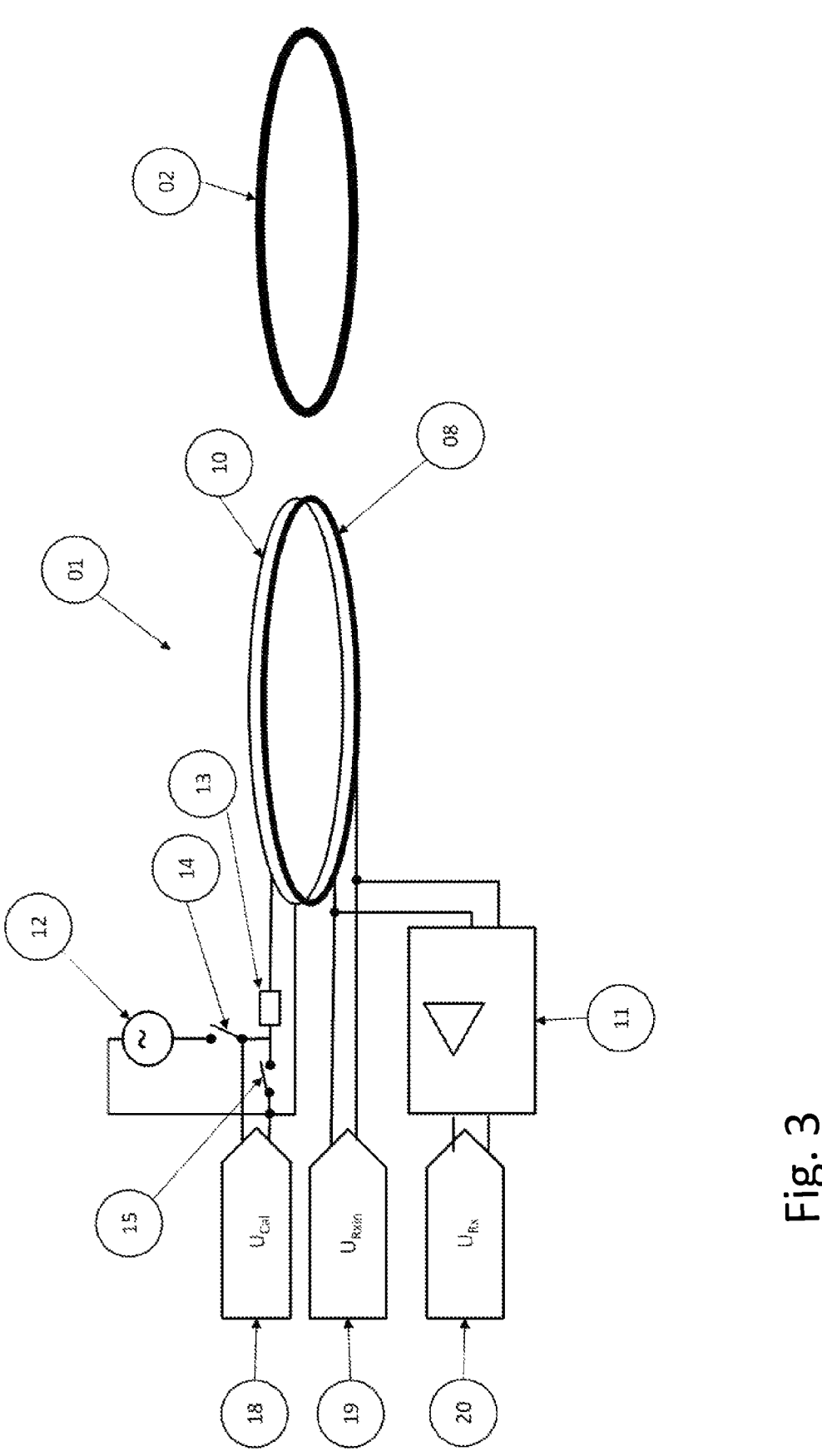
FIG. 3 the simplified measuring assembly according to FIG. 1, 2 in detail (stages S1+S2)

FIG. 3 shows the measuring assembly 01 with a combination of the first stage S1 and the second stage S2 according to FIG. 1, 2 in detail for a practical measurement set-up (the transmitting coil 02 is illustrated on the right, the receiving coil 08 on the left). With the measuring device 18 the voltage $U_{cal}$ (at the output of the calibration signal generator 12 for measuring the mutual inductance $M_{RC}$) is measured, with the measuring device 19 the voltage $U_{RXin}$ (through strong inductive coupling of the calibration coil 10 with the receiving coil 08) is measured, and with the measuring device 20 the voltage $U_{Rx}$ is measured as actual measurement signal. Reference numbers which are not mentioned are to be seen from the other figures.

Figure 4:
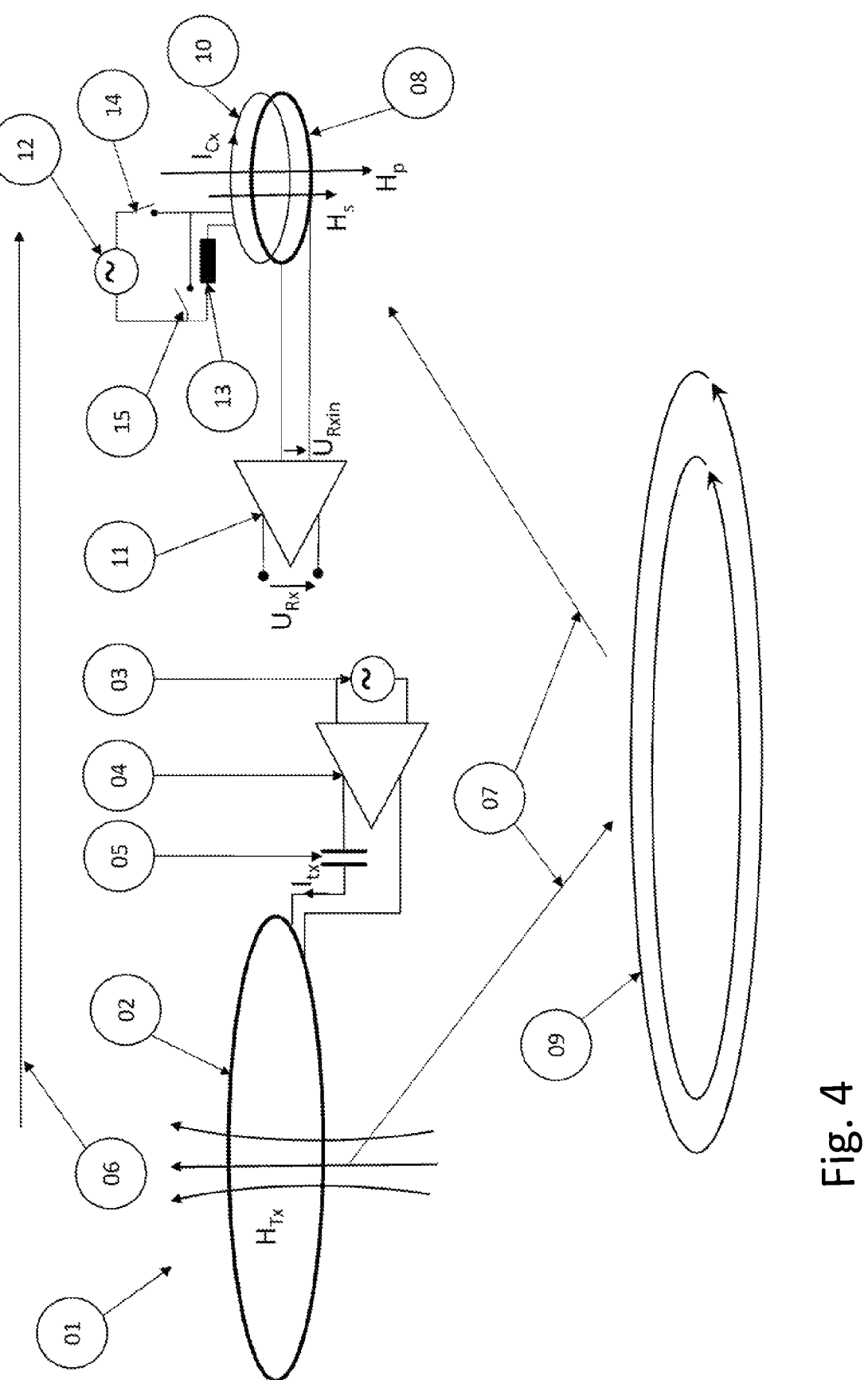
FIG. 4 the simplified measuring assembly according to FIG. 1, 2, 3 in measuring operation.

In FIG. 4 the measuring operation is illustrated in a simplified measuring assembly 01. The transmission current $I_{Tx}$ generates the transmission field $H_{Tx}$ through the transmission coil 02. This spreads in various directions, wherein basically a differentiation is made between the primary path 06 and the secondary path 07. Along the primary path 06 the direct signal propagation takes place from the transmitting coil 02 to the receiving coil 08. The transmission field $H_{Tx}$ generates the primary field $H_P$ at the site of the receiving coil 08. Along the secondary path 07 the propagation takes place of signals generated through the conductive medium 09. The transmission field $H_{Tx}$ induces eddy currents (representation by circles in FIG. 4, 5) in the conductive medium 09 (for example a geological, conductive substrate), which eddy currents in turn are the source of further magnetic alternating fields of identical frequency. These eddy currents generate the secondary field $H_s$ at the site of the receiving coil 08. The conductivity of the medium 09 can be calculated from the ratio $H_s/H_P$. For the application for measurement of the ice thickness, alternatively the distance from the surface to a conductive medium 09—here the seawater—can be calculated from the ratio $H_s/H_P$. All magnetic alternating fields induce in the receiving coil 08 a voltage $U_{RXin}$, which is amplified by the receive amplifier 11 and is subsequently measured and emitted as voltage $U_{Rx}$. In order to be able to make a statement concerning which voltage $U_{Rx}$ corresponds to which ratio $H_s/H_P$, the calibration coil 10 is used, which generates the known ratio of $H_{Cx}/H_P$(=calibration factor).

Figure 5:
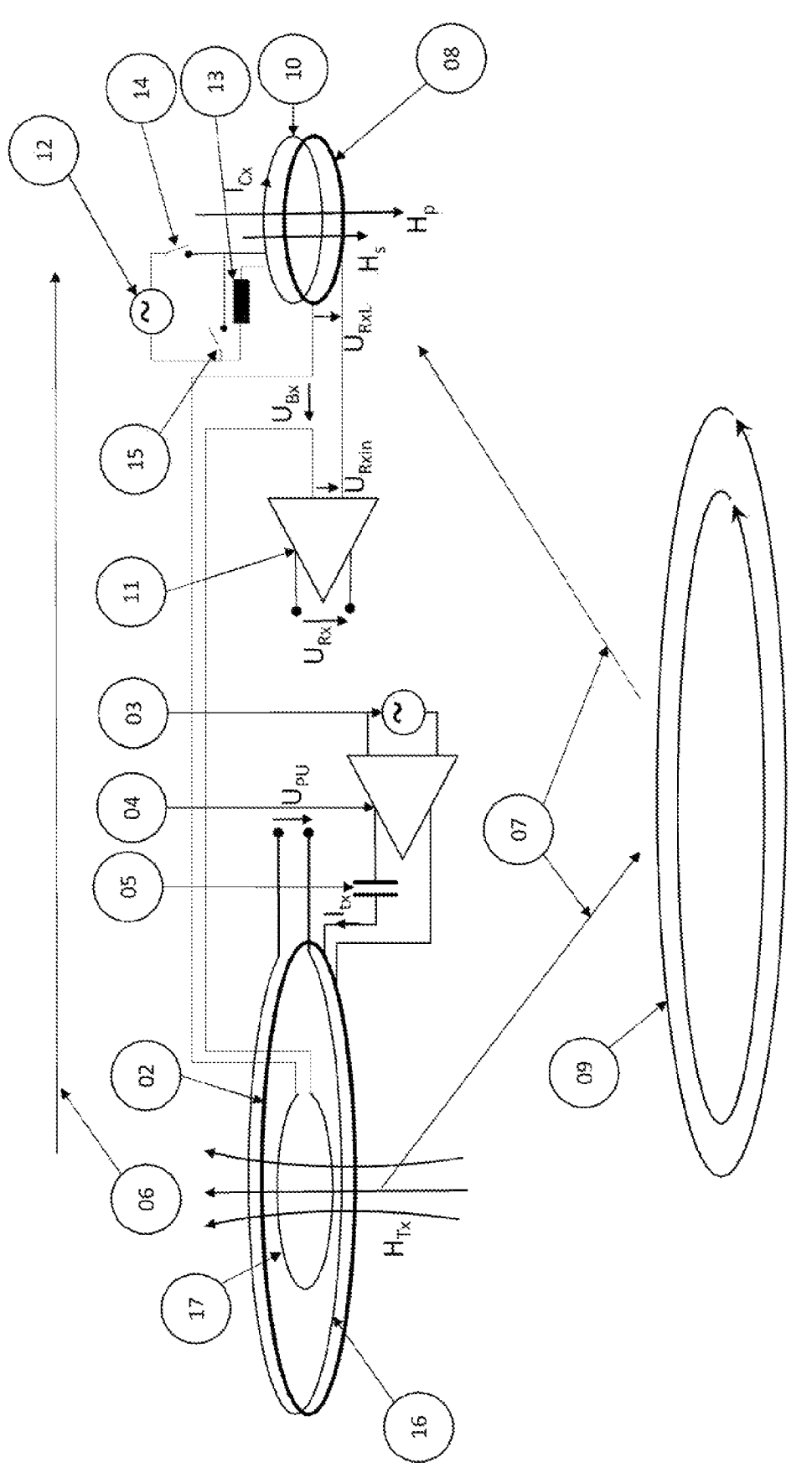
FIG. 5 a complete measuring arrangement according to FIG. 1, 2, 3, 4 in measuring operation.

The representation of the measuring assembly 01 in FIG. 4 is not complete with respect to an optimum mode of operation. The elements are missing which are only necessary in the actual measurement. FIG. 5 shows the complete set-up of the measuring assembly 01. Here, additionally also a pick-up coil 16 and a compensation coil 17 are illustrated. As the receiving coil 08 is only to receive the secondary field $H_s$, but the primary field $H_P$ would drive the receive amplifier 11 to saturation, the influence of the primary field $H_P$ is minimized through the compensation coil 17. The pick-up coil 16, in turn, measures the transmission field $H_{Tx}$. By means of the pick-up coil 16, fluctuations in the transmission current $I_{Tx}$ and thus in the emitted magnetic field $H_{Tx}$ can be compensated. Additionally shown are the voltages $U_B$ at the connections of the compensation coil 17, $U_{RxL}$ at the connections of the receiving coil 08 and $U_{PU}$ at the connections of the pick-up coil 16. In the complete set-up in FIG. 5 the voltage $U_{RXin}$ results at the input of the receive amplifier 11 through the series connection of $U_B$ and $U_{RxL}$, whereby the influence of the primary field $H_P$ at the site of the receiving coil 08 on the received voltage $U_{RXin}$ is minimized. So that fluctuations in the transmission current $I_{Tx}$ are not erroneously interpreted as fluctuations in the secondary field $H_s$, the voltage $U_{PU}$ of the pick-up coil 16 is used, in order to compensate occurring fluctuations in the transmission current $I_{Tx}$, as the voltage $U_{PU}$ is directly proportional thereto (transmitting- and pick-up coil are likewise inductively coupled).

LIST OF FORMULA SYMBOLS $A_{Cx}$ effective area of calibration coil 10

$A_{Rx}$ effective area of receiving coil 08

$H_{Cx}$ calibration field, which during the calibration (second stage S2) functions as secondary field $H_s$ with known strength (phase and amplitude, in relation to the occurring, unknown primary field $H_P$)

$H_P$ primary field, magnetic alternating field at the site of the receiving coil 08, which arrives via the primary path 06 from the transmitting coil 02 to the receiving coil 08

$H_s$ secondary field, magnetic alternating field at the site of the receiving coil 08, which arrives via the secondary path 07 from the transmitting coil 02 to the receiving coil 08

$H_{Tx}$ transmission field, magnetic alternating field emitted from the transmitting coil 02

$H_{Cx}/H_P$ calibration factor $I_{cal}$ current through the calibration coil 10 during the determining of the calibration factor (first stage S1)

$I_{Cx}$ current through the calibration coil 10 during the calibration (second stage S2)

$I_{Tx}$ current through the transmitting coil 02 during the calibration (second stage S2) and the actual measurements j imaginary unit $M_{RC}$ mutual inductance as measurement for the strong inductive coupling between calibration coil 10 and receiving coil 08

$N_{Cx}$ winding number of the calibration coil 10

$N_{Rx}$ winding number of the receiving coil 08

$U_B$ voltage at the connections of the compensation coil 17, serves for the compensation of the contribution of primary field $H_P$ to the received voltage $U_{RXin}$ $U_{cal}$ voltage at the connections of the calibration signal generator 12, is used as reference for determining the strong inductive coupling between calibration coil 10 and receiving coil 08

$U_{PU}$ voltage at the connections of the pick-up coil 16, serves for the compensation of fluctuations in the transmission current $I_{Tx}$ $U_{Rx}$ voltage at the output of the receive amplifier 11 (measurement signal)

$U_{RXin}$ voltage at the input of the receive amplifier 11 as sum (series connection) of $U_{Bx}$ and $U_{RxL}$ in the simplified measurement set-up 01 according to FIGS. 1 to 4

$U_{RxL}$ voltage at the connections of the receiving coil 08 in the complete measurement set-up 01 according to FIG. 5 for differentiation between the voltage at the receiving coil 08 and the voltage $U_{RXin}$, which is compensated by the influence of the primary field $H_P$ $Z_{Cx}$ complex resistance (impedance) of the series connection of calibration coil 10 and calibration resistor 13 (changeable load resistor) for changing the calibration field ω angular frequency While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE NUMBERS

01 measuring assembly

02 transmitting coil

03 transmitting signal generator

04 transmission amplifier

05 resonance capacitor

06 primary path

07 secondary path

08 receiving coil

09 conductive medium

10 calibration coil

11 receive amplifier

12 calibration signal generator

13 changeable calibration resistor

14 first switch for S1

15 further switch for S2

16 pick-up coil

17 compensation coil

18 measuring device for $U_{cal}$

19 measuring device for $U_{RXin}$

20 measuring device for $U_{Rx}$

S1 first stage, metrological determining of the calibration factor $H_{Cx}/H_P$

S2 second stage, carrying out the calibration

The invention claimed is:

1. An indirect calibration method for electromagnetic induction for determining physical parameters of an electrically conductive medium from a ratio (HS/HP) of a magnetic secondary field (HS), received in a receiving coil, to a magnetic primary field (HP) emitted from a transmitting coil electrically connected to a transmission signal generator, in which, as measurement for the ratio (HS/HP), a received voltage (URx) is measured at an output of a receive amplifier electrically connected to the receiving coil, which is calibrated by a series connection of at least one calibration coil and of a changeable calibration resistor and of a calibration factor (HCx/HP) adjustable therethrough, the receiving coil being permanently inductively coupled with the calibration coil, a calibration pulse, generated in the calibration coil, inducing a calibration field (HCx), that induces a magnetic flux in the receiving coil, areas and winding numbers of the receiving coil and the calibration coil being known, the indirect calibration method comprising:

a first stage, in which the transmitting coil is inactive or shielded, and a calibration signal generator is connected to the series connection of calibration resistor and calibration coil, and in which the calibration pulse is generated electrically by the calibration signal generator, and, with adjusting a resistance of the calibration resistor, a calibration voltage (Ucal) at the series connection of the calibration coil and the calibration resistor and the received voltage (URxin) at the receiving coil at an input of the receive amplifier are measured simultaneously for determining a generated mutual inductance (MRC) between the calibration coil and the receiving coil, from which, with inclusion of the known areas and winding numbers of calibration coil and receiving coil, the calibration factor (HCx/HP) is derived; and a second stage, in which the transmitting coil is active via the transmitting signal generator, and the calibration coil is short-circuited via fixing the resistance of the calibration resistor, and in which the calibration pulse is generated inductively through a primary field (HP) generated by the transmitting signal generator and the transmitting coil, and in which the received voltage is measured at the output of the receive amplifier so as to calibrate the received voltage to the ratio, using the calibration factor (HCx/HP), the calibration factor (HCx/HP) being determined metrologically in the first stage.

2. The indirect calibration method of claim 1, wherein the secondary field (HS) is shielded, at least in the second stage.

3. The indirect calibration method of claim 1, wherein the first stage is carried out chronologically independently of the second stage.

4. A measuring assembly for carrying out the indirect calibration method of claim 1, comprising:

at least one transmitting coil; and the receiving coil; and the series connection at least of the calibration coil and the calibration resistor, wherein the receiving coil and the calibration coil are arranged adjacent to one another with generation of a permanent inductive coupling, and wherein a calibration signal generator is provided, the calibration signal generator being electrically connectable to the series connection.

5. The measuring assembly of claim 4, further comprising:

a first switch via which the calibration coil is electrically connectable to the calibration signal generator via the calibration resistor.

6. The measuring assembly of claim 5, further comprising:

a further switch via which the calibration coil is electrically connectable only to the calibration resistor.

7. The measuring assembly claim 4, wherein the receiving coil and the calibration coil are arranged on a shared core and have an area ratio of one.

8. The measuring assembly claim 4, wherein the receiving coil and the calibration coil have a winding ratio of one.

* * * * *